(12) United States Patent
Ivanov

(10) Patent No.: US 8,432,222 B2
(45) Date of Patent: Apr. 30, 2013

(54) APPARATUS AND METHODS FOR ELECTRONIC AMPLIFICATION

(75) Inventor: Evgueni Ivanov, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/233,829

(22) Filed: Sep. 15, 2011

(65) Prior Publication Data

US 2013/0069718 A1    Mar. 21, 2013

(51) Int. Cl.
*H03F 3/45* (2006.01)
(52) U.S. Cl.
USPC .................................... 330/258; 330/69
(58) Field of Classification Search ............ 330/69, 330/253, 258, 260
See application file for complete search history.

(56) References Cited

U.S. PATENT DOCUMENTS

| | | | |
|---|---|---|---|
| 5,300,896 A | 4/1994 | Suesserman | |
| 5,351,050 A | 9/1994 | Thompson et al. | |
| 5,703,589 A | 12/1997 | Kalthoff et al. | |
| 5,726,600 A * | 3/1998 | Raghavan et al. | 330/258 |
| 6,249,696 B1 | 6/2001 | Olson et al. | |
| 6,396,343 B2 | 5/2002 | Chee | |
| 6,538,503 B2 | 3/2003 | Burt | |
| 6,559,720 B1 * | 5/2003 | Huijsing et al. | 330/253 |
| 6,844,775 B2 | 1/2005 | Doorenbos et al. | |
| 7,109,797 B1 * | 9/2006 | Turvey | 330/258 |
| 7,148,734 B2 | 12/2006 | Tanzawa | |
| 7,167,029 B2 | 1/2007 | Soeraasen | |
| 7,167,051 B2 | 1/2007 | Botker | |
| 7,193,457 B2 | 3/2007 | Douts et al. | |
| 7,202,738 B1 | 4/2007 | Huijsing et al. | |
| 7,368,999 B2 | 5/2008 | Natzke | |
| 7,453,305 B2 | 11/2008 | Moane et al. | |
| 7,521,994 B2 | 4/2009 | Theus et al. | |
| 7,633,317 B2 | 12/2009 | Miranda et al. | |
| 2003/0122624 A1* | 7/2003 | Tomasini et al. | 330/258 |
| 2006/0119412 A1 | 6/2006 | Wei et al. | |
| 2006/0176109 A1 | 8/2006 | Huijsing et al. | |
| 2007/0013440 A1 | 1/2007 | Chen et al. | |
| 2008/0061857 A1 | 3/2008 | Kapusta | |
| 2009/0115507 A1 | 5/2009 | Cho | |

OTHER PUBLICATIONS

Stitt, R. Mark, *AC Coupling Instrumentation and Difference Amplifiers* (1990), 4 pages (available at World Wide Web page: ti.com/analog/docs/litabsmultiplefilelist.tsp?literaureNumber=sboa003&docCategoryId=1&familyId=1613).

Fortunato, Mark, *A New Filter Topology for Analog High-Pass Filters* (2008), 8 pages (available at World Wide Web page: ti.com/lit/an/slyt299.pdf).

(Continued)

*Primary Examiner* — Khanh V Nguyen
(74) *Attorney, Agent, or Firm* — Knobbe Martens Olson & Bear LLP

(57) ABSTRACT

Apparatus and methods for electronic amplification are provided. In one embodiment, an amplifier includes a first adaptive level shifter (ALS), a second ALS, a first transconductance amplification circuit, a second transconductance amplification circuit, and a transimpedance amplification circuit. The first ALS and the second ALS are electrically coupled to the first and second transconductance amplification circuits to improve the input voltage range and common-mode rejection ratio (CMRR) of the amplifier. The transimpedance amplification block is electrically coupled to the first and second transconductance amplification blocks and generates an output voltage of the amplifier. The first ALS receives a differential input voltage, and the second ALS is configured to receive a feedback signal configured to change in relation to the output voltage signal.

20 Claims, 4 Drawing Sheets

OTHER PUBLICATIONS

Analog Devices AD8129/AD8130 Data Sheet, *Low Cost 270 MHz Differential Receiver Amplifiers* (2005), 40 pages (available at World Wide Web page: analog.com/en/specialty-amplifiers/differential-amplifiers/ad8130/products/product.html).

Texas Instruments INA333 Datasheet, *Micro-Power (50 µA), Zerø-Drift-to-Rail Out Instrumentation Amplifier* (Oct. 2008), 26 pages (available at World Wide Web page: ti.com/lit/ds/symlink/ina333.pdf.

Fan et al., *A 1.8 µW 60 nV/√Hz Capacitively-Coupled Chopper Instrumentation Amplifier in 65 nm CMOS for Wireless Sensor Nodes*, IEEE Journal of Solid-State Circuits, vol. 46, No. 7 (Jul. 2011), 10 pages.

Kwan et al., *An Adaptive Analog Continuous-Time CMOS Biquadratic Filter*, IEEE Custom Integrated Circuits Conference (1991), 4 pages.

Gregoire, Robert, *An Over-60 dB True Rail-to-Rail Performance Using Correlated Level Shifting and Opamp With Only 30 DB Loop Gain*, IEEE International Solid-State Circuits Conference (2008), 3 pages.

Yazicioglu R.F. et al., *A 60 µW 60nV/√Hz Readout Front-End for Portable Biopotential Acquisition Systems*, IEEE Journal of Solid-State Circuits, vol. 42, No. 5 (May 2007), 11 pages.

van den Dool et al., *Indirect Current-Feedback Instrumentation Amplifier With a Common-Mode Input Range that Includes the Negative Rail*, IEEE Journal of Solid-State Circuits, vol. 28, No. 7 (Jul. 1993), 7 pages.

Kitchin et al., *A Designer's Guide to Instrumentation Amplifiers*, 3rd Edition (2006), 130 pages (available at World Wide Web page: analog.com/en/specialty-amplifiers/current-sense-amplifiers/products/design-handbooks/cu_dh_designers_guide_to_instrumentation_amps/resources/fca.html).

Song et al., *A Robust Rail-to-Rail Input Stage with Constant-$g_m$ and Constant Slew Rate Using a Novel Level Shifter*, IEEE International Symposium on Circuits and Systems (2007), 4 pages.

Wang et al., *Low-Power Instrumental Amplifier for Portable ECG*, IEEE Circuits and Systems International Conference on Testing and Diagnostics (2009), 4 pages.

\* cited by examiner

APPARATUS AND METHODS FOR ELECTRONIC AMPLIFICATION

CROSS-REFERENCE TO RELATED APPLICATIONS

This application is related to U.S. application Ser. No. 13/233,792, entitled APPARATUS AND METHODS FOR ADAPTIVE COMMON-MODE LEVEL SHIFTING (Inventor: Evgueni Ivanov; filed on even date herewith), the disclosure of which is incorporated herein by reference in its entirety.

BACKGROUND

1. Field

Embodiments of the invention relate to electronic devices, and more particularly, to amplifiers.

2. Description of the Related Technology

An amplifier, such as an operational amplifier or an instrumentation amplifier, can include one or more transconductance amplification blocks to aid in achieving a desired performance characteristic. For example, the amplifier can include a pair of transconductance amplification blocks arranged in an indirect current-feedback configuration.

The transconductance amplification blocks of the amplifier can impact the amplifier's performance. For example, the transconductance amplification blocks can limit an operational input voltage range and/or common-mode rejection ratio (CMRR) of the amplifier. Furthermore, in certain implementations transconductance amplification blocks can have relatively high power consumption or may saturate when amplifying a differential input voltage signal having a relatively large magnitude.

There is a need for amplifiers having improved performance. Additionally, there is need for amplifiers having large operation input voltage range, high common-mode rejection, and low power consumption over a variety of operating conditions, including when amplifying relatively large differential input voltage signals.

SUMMARY

In one embodiment, an apparatus includes a first level shifter, a second level shifter, a first transconductance amplification circuit, a second transconductance amplification circuit, and a transimpedance amplification circuit. The first level shifter has a first input, a second input, a first output, and a second output. The first and second inputs are configured to receive a differential input voltage signal, and the first level shifter is configured to control a common mode voltage of the first and second outputs to be about equal to a first voltage and to control a difference in voltage between the first and second outputs based on the differential input voltage signal. The second level shifter has a first input, a second input, a first output, and a second output, and the second level shifter is configured to control a common mode voltage of the first and second outputs to be about equal to the first voltage. The first transconductance amplification circuit has a first input, a second input, a first output, and a second output. The first input of the first transconductance amplification circuit is electrically connected to the first output of the first level shifter. The second transconductance amplification circuit has a first input, a second input, a first output, and a second output. The second input of the second transconductance amplification circuit is electrically connected to the second output of the second level shifter, and the first and second outputs of the first transconductance amplification circuit are electrically connected to the second and first outputs of the second transconductance amplification circuit, respectively. The transimpedance amplification circuit has a first input, a second input, and an output, and the first and second inputs are electrically connected to the first and second outputs of the first transconductance amplification circuit.

In another embodiment, an apparatus includes a first means for level shifting, a second means for level shifting, a first transconductance amplification circuit, a second transconductance amplification circuit, and a transimpedance amplification circuit. The first level shifting means has a first input, a second input, a first output, and a second output. The first and second inputs are configured to receive a differential input voltage signal, and the first level shifting means is configured to control a common mode voltage of the first and second outputs to be about equal to a first voltage and to control a difference in voltage between the first and second outputs based on the differential input voltage signal. The second means for level shifting has a first input, a second input, a first output, and a second output, and the second level shifting means is configured to control a common mode voltage of the first and second outputs of the second level shifting means to be about equal to the first voltage. The first transconductance amplification circuit has a first input, a second input, a first output, and a second output, and the first input of the first transconductance amplification circuit is electrically connected to the first output of the first level shifting means. The first transconductance amplification circuit is configured to convert the difference in voltage at the first and second inputs to generate a first differential current between the first and second outputs. The second transconductance amplification circuit has a first input, a second input, a first output, and a second output, and the second input of the second transconductance amplification circuit is electrically connected to the second output of the second level shifting means. The first and second outputs of the first transconductance amplification circuit are electrically connected to the second and first outputs of the second transconductance amplification circuit, respectively. The second transconductance amplification circuit is configured to convert the difference in voltage at the first and second inputs to generate a second differential current between the first and second outputs. The transimpedance amplification circuit has a first input, a second input, and an output, and the first and second inputs are electrically connected to the first and second outputs of the first transconductance amplification circuit, respectively. The transimpedance amplification circuit is configured to convert a difference between the first and second differential currents to generate an output voltage signal on the output.

In another embodiment, a method of electronic amplification includes receiving a differential input voltage signal, shifting a common mode voltage of the differential input voltage signal to generate a first level-shifted differential voltage signal using a first level shifter, shifting a common mode voltage of a feedback signal associated with an output voltage signal to generate a second level-shifted differential voltage signal using a second level shifter, converting the first and second level-shifted differential voltage signals to a first differential current signal and to a second differential current signal, combining the first and second differential current signals, and amplifying the combined differential current signals using a transimpedance amplification block to generate the output voltage signal.

DETAILED DESCRIPTION OF EMBODIMENTS

Figure 1:
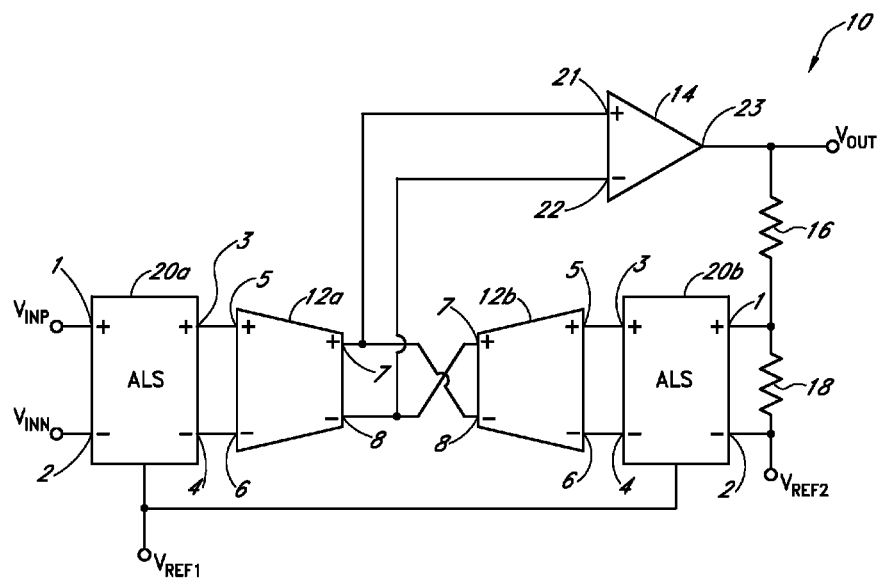
FIG. 1 is a schematic block diagram illustrating one embodiment of an amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Amplifiers

FIG. 1 is a schematic block diagram illustrating one embodiment of an amplifier 10. The amplifier 10 includes a first transconductance amplification block 12a, a second transconductance amplification block 12b, a transimpedance amplification block 14, a first resistor 16, a second resistor 18, a first adaptive level shifter 20a, and a second adaptive level shifter 20b.

The amplifier 10 includes a positive or non-inverted input voltage terminal $V_{INP}$, a negative or inverted input voltage terminal $V_{INN}$, an output voltage terminal $V_{OUT}$, a first reference voltage terminal $V_{REF1}$, and a second reference voltage terminal $V_{REF2}$. The amplifier 10 can receive a differential input voltage signal between the positive and negative input voltage terminals $V_{INP}$, $V_{INN}$, and can amplify the differential input voltage signal to generate an output voltage signal on the output voltage terminal $V_{OUT}$.

The first and second transconductance amplification blocks 12a, 12b each include a non-inverted voltage input 5, an inverted voltage input 6, a non-inverted current output 7, and an inverted current output 8. The first and second transconductance amplification blocks 12a, 12b can be used to amplify a differential input voltage received between the non-inverted and inverted voltage inputs 5, 6 to generate a differential output current between the non-inverted and inverted current outputs 7, 8.

The transimpedance amplification block 14 includes a non-inverted current input 21, an inverted current input 22, and a voltage output 23. The transimpedance amplification block 14 can be used to amplify a differential input current received between the non-inverted and inverted current inputs 21, 22 to generate a single-ended output voltage on the voltage output 23. Although the transimpedance amplification block 14 is illustrated as including a single-ended output voltage, in certain implementations the transimpedance amplification block 14 can be adapted to generate a differential output voltage.

The first and second adaptive level shifters 20a, 20b each include a non-inverted voltage input 1, an inverted voltage input 2, a non-inverted voltage output 3, and an inverted voltage output 4. The first and second adaptive level shifters 20a, 20b can be used to shift a common-mode voltage level of a differential voltage signal received on the non-inverted and inverted voltage inputs 1, 2 to a level about equal to the voltage of the first reference voltage terminal $V_{REF1}$. For example, in certain implementations the first and second adaptive level shifters 20a, 20b can be configured to generate a voltage on the non-inverted voltage output 3 that is about equal to ($V_{IN1}$−$V_{SHIFT}$) and a voltage on the inverted voltage output 4 that is about equal to ($V_{IN2}$−$V_{SHIFT}$), where $V_{IN1}$ is the voltage of the non-inverted voltage input 1, $V_{IN2}$ is the voltage of the inverted voltage input 2, and $V_{SHIFT}$ is about equal to the difference between the common-mode input voltage ($V_{IN1}$+$V_{IN2}$)/2 and the voltage of the first reference voltage terminal $V_{REF1}$. However, other implementations of the adaptive level shifters can be used, including, for example, configurations that both shift the common-mode voltage level of the differential voltage signal received on the non-inverted and inverted voltage inputs 1, 2 and that amplify or attenuate the differential voltage signal generated between the non-inverted and inverted voltage outputs 3, 4.

The voltage of the first reference voltage terminal $V_{REF1}$ can be generated in any suitable manner. For example, in some implementations, the first and second adaptive level shifters are disposed in an integrated circuit (IC), and the voltage of the first reference voltage terminal $V_{REF1}$ can be generated using a voltage regulator or other suitable voltage generator disposed in the IC. However, in other implementations, the first reference voltage terminal $V_{REF1}$ is electrically connected to a pad of an IC so as to allow an end-user to control the voltage of the first reference voltage terminal $V_{REF1}$.

In the configuration illustrated in FIG. 1, the non-inverted and inverted voltage inputs 1, 2 of the first adaptive level shifter 20a are electrically connected to the positive and negative input voltage terminals $V_{INP}$, $V_{INN}$, respectively. Additionally, the non-inverted and inverted voltage outputs 3, 4 of the first adaptive level shifter 20a are electrically connected to the non-inverted and inverted voltage inputs 5, 6 of the first transconductance amplification block 12a, respectively. Furthermore, the non-inverted current output 7 of the first transconductance amplification block 12a is electrically connected to the non-inverted current input 21 of the transimpedance amplification block 14 and to the inverted current output 8 of the second transconductance amplification block 12b. Additionally, the inverted current output 8 of the first transconductance amplification block 12a is electrically connected to the inverted current input 22 of the transimpedance amplification block 14 and to the non-inverted current output 7 of the second transconductance amplification block 12b.

The voltage output 23 of the transimpedance amplification block 14 is electrically connected to the output voltage terminal $V_{OUT}$ and to a first end of the first resistor 16. The first resistor 16 further includes a second end electrically connected to a first end of the second resistor 18 and to the non-inverted voltage input 1 of the second adaptive level shifter 20b. The second resistor 18 further includes a second end electrically connected to the inverted voltage input 2 of the second adaptive level shifter 20b and to the second reference voltage terminal $V_{REF2}$. Additionally, the non-inverted and inverted voltage outputs 3, 4 of the second adaptive level shifter 20b are electrically connected to the non-inverted and inverted voltage inputs 5, 6 of the second transconductance amplification block 12b, respectively.

The first adaptive level shifter 20a can generate a voltage between the non-inverted and inverted voltage outputs 3, 4 that has a common-mode voltage about equal to the voltage of the first reference voltage terminal $V_{REF1}$ and a differential voltage that is about equal to the difference in voltage between the positive and negative voltage terminals $V_{INP}$, $V_{INN}$. Additionally, the first transconductance amplification block 12a can amplify the voltage difference between the non-inverted and inverted voltage outputs 3, 4 of the first adaptive level shifter 20a to generate a differential output current between the non-inverted and inverted current outputs 7, 8 of the first transconductance amplification block 12a.

In the illustrated configuration, the differential output current of the first transconductance amplification block 12a is provided to the non-inverted current inputs 21, 22 of the transimpedance amplification block 14. Accordingly, the voltage output 23 of the transimpedance amplification block 14 can change in relation to the difference in voltage or differential input voltage $V_{DIFF}$ between the positive and negative voltage terminals $V_{INP}$, $V_{INN}$. For example, when the positive voltage terminal $V_{INP}$ increases relative to the negative voltage terminal $V_{INN}$, the differential output current of the first transconductance amplification block 12a can increase, which in turn can increase the differential input current of the transimpedance amplification block 14 and the voltage of the output terminal $V_{OUT}$. Similarly, when the positive voltage terminal $V_{INP}$ decreases relative to the negative voltage terminal $V_{INN}$, the differential output current of the first transconductance amplification block 12a can decrease, which in turn can decrease the differential input current of the transimpedance amplification block 14 and the voltage of the output terminal $V_{OUT}$.

The first and second resistors 16, 18 can be used to control the gain of the amplifier 10. For example, when the differential input voltage $V_{DIFF}$ or difference between the positive and negative voltage terminals $V_{INP}$, $V_{INN}$ increases, the voltage of the output voltage terminal $V_{OUT}$ can increase until the voltage difference between the non-inverted and inverted voltage inputs 1, 2 of the second adaptive level shifter 20b is about equal to the differential input voltage $V_{DIFF}$. Since the ratio of the first and second resistors 16, 18 can determine the magnitude of the voltage of the output voltage terminal $V_{OUT}$ that corresponds to a change of voltage across the non-inverted and inverted voltage inputs 1, 2 of the second adaptive level shifter 20b, the first and second resistors 16, 18 can be used to control the gain of the amplifier 10. For example, in certain implementations, the gain of the amplifier 10 can be about equal to $1+R_{16}/R_{18}$, where $R_{16}$ is the resistance of the first resistor 16 and $R_{18}$ is the resistance of the second resistor 18. In some implementations, the second resistor 18 can be omitted to aid in reducing the gain of the amplifier 10. In one embodiment, the gain of the amplifier 10 can be selected to be in the range of about 1 to about 100,000. However, other gain levels will be readily determined by one of skill in the art.

In some implementations, the first and second adaptive level shifters 20a, 20b, the first and second transconductance amplification blocks 12a, 12b, and the transimpedance amplification block 14 are disposed in an integrated circuit (IC), and the first and second resistors 16, 18 are components disposed external to the IC. By configuring the IC in this manner, an end-user can externally control the gain of the amplifier 10. However, in other implementations, the first and second resistors 16, 18 can be disposed in the same IC as the first and second adaptive level shifters 20a, 20b, the first and second transconductance amplification blocks 12a, 12b, and/or the transimpedance amplification block 14.

The output offset voltage of the amplifier 10 can be controlled using the second reference voltage terminal $V_{REF2}$. For example, the voltage of the output terminal $V_{OUT}$ can be about equal to the voltage of the second reference voltage terminal $V_{REF2}$ when the differential input voltage $V_{DIFF}$ between the positive and negative input voltage terminals $V_{INP}$, $V_{INN}$ is about equal to 0 V.

As was described above, in some implementations the common-mode voltage of the non-inverted and inverted voltage outputs 3, 4 of the first adaptive level shifter 20a can be about equal to the voltage of the first reference voltage terminal $V_{REF1}$ and the differential voltage between the non-inverted and inverted voltage outputs 3, 4 of the first adaptive level shifter 20a can be about equal to the differential input voltage $V_{DIFF}$ between the positive and negative voltage terminals $V_{INP}$, $V_{INN}$. By including the first adaptive level shifter 20a, the input voltage operating range of the amplifier 10 can be improved. For example, in certain implementations the first adaptive level shifter 20a can have an input voltage operating range that is greater than an input voltage operating range of the first transconductance amplification block 12a, and thus including the first adaptive level shifter 20a can help prevent the input voltage operating range of the first transconductance amplification block 12a from limiting the overall input voltage operating range of the amplifier 10.

The first adaptive level shifter 20a can also aid in improving the common-mode rejection ratio (CMRR) of the amplifier 10. For example, in some implementations, the first adaptive level shifter 20a can increase the overall CMRR of the amplifier 10 by about a factor equal to the CMRR of the first adaptive level shifter 20a. Accordingly, including the first adaptive level shifter 20a in the amplifier 10 can improve the overall CMRR of the amplifier and may relax a CMRR design constraint of the first and second transconductance amplification blocks 12a, 12b and/or may avoid a need to employ more complicated and/or expensive CMRR improvement schemes.

The second adaptive level shifter 20b can help prevent an input offset voltage of the first adaptive level shifter 20a from impacting the performance of the amplifier 10. For example, the first and second adaptive level shifters 20a, 20b can be configured to have similar circuit topologies and layouts, and thus can have about the same input offset voltage. Since the non-inverted and inverted current outputs 7, 8 of the first and second transconductance amplification blocks 12a, 12b are cross-coupled, including the first adaptive level shifter 20a in the signal path through the first transconductance amplification block 12a and the second adaptive level shifter 20b in the feedback path through the second transconductance amplification block 12b can help cancel errors of the amplifier 10 associated with the input offset voltages of the first and second adaptive level shifters 20a, 20b. Accordingly, including both the first and second adaptive level shifters 20a, 20b in the amplifier 10 can improve the overall performance of the amplifier 10 relative to a scheme using only the first adaptive level shifter 20a.

Including the second adaptive level shifter 20b can also improve the range of voltages of the second reference voltage terminal $V_{REF2}$ over which the amplifier 10 can operate. For example, in certain implementations the second adaptive level shifter 20b can have an input voltage operating range that is greater than an input voltage operating range of the second transconductance amplification block 12b, and thus including the second adaptive level shifter 20b can help prevent the second transconductance amplification block 12b from limiting the range of voltages of the second reference voltage terminal $V_{REF2}$ over which the amplifier 10 can operate.

The second adaptive level shifter 20b can also aid in improving the common-mode rejection ratio (CMRR) of the amplifier 10 with respect to variations of the voltage of the second reference voltage terminal $V_{REF2}$. For example, in some implementations, the second adaptive level shifter 20b can increase the overall CMRR of the amplifier 10 with respect to variations of the voltage of the second reference voltage terminal $V_{REF2}$ by a factor about equal to the CMRR of the second adaptive level shifter 20b. Accordingly, including the second adaptive level shifter 20b in the amplifier 10 can improve the overall CMRR of the amplifier with respect to variations of the voltage of the second reference voltage terminal $V_{REF2}$ and may relax a CMRR design constraint of the first and second transconductance amplification blocks 12a, 12b and/or may avoid a need to employ more complicated and/or expensive CMRR improvement schemes.

Figure 2:
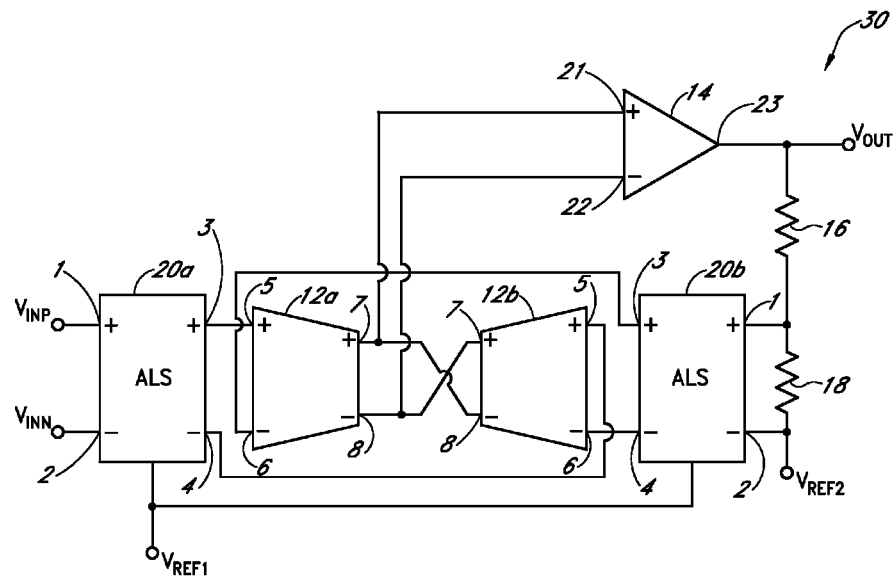
FIG. 2 is a schematic block diagram illustrating another embodiment of an amplifier.

FIG. 2 is a schematic block diagram illustrating another embodiment of an amplifier 30. The amplifier 30 includes the first transconductance amplification block 12a, the second transconductance amplification block 12b, the transimpedance amplification block 14, the first resistor 16, the second resistor 18, the first adaptive level shifter 20a, and the second adaptive level shifter 20b.

The amplifier 30 includes the non-inverted input voltage terminal $V_{INP}$, the inverted input voltage terminal $V_{INN}$, the output voltage terminal $V_{OUT}$, the first reference voltage terminal $V_{REF1}$, and the second reference voltage terminal $V_{REF2}$. The amplifier 30 can receive a differential input voltage signal $V_{DIFF}$ between the positive and negative input voltage terminals $V_{INP}$, $V_{INN}$ and can amplify the differential input voltage signal to generate an output voltage signal on the output voltage terminal $V_{OUT}$.

The non-inverted and inverted voltage inputs 1, 2 of the first adaptive level shifter 20a are electrically connected to the positive and negative input voltage terminals $V_{INP}$, $V_{INN}$, respectively. Additionally, the non-inverted voltage output 3 of the first adaptive level shifter 20a is electrically connected to the non-inverted voltage input 5 of the first transconductance amplification block 12a, and the inverted voltage output 4 of the first adaptive level shifter 20a is electrically connected to the non-inverted voltage input 5 of the second transconductance amplification block 12b. Furthermore, the non-inverted current output 7 of the first transconductance amplification block 12a is electrically connected to the non-inverted current input 21 of the transimpedance amplification block 14 and to the inverted current output 8 of the second transconductance amplification block 12b. Additionally, the inverted current output 8 of the first transconductance amplification block 12a is electrically connected to the inverted current input 22 of the transimpedance amplification block 14 and to the non-inverted current output 7 of the second transconductance amplification block 12b.

The voltage output of the transimpedance amplification block 14 is electrically connected to the output voltage terminal $V_{OUT}$ and to a first end of the first resistor 16. The first resistor 16 further includes a second end electrically connected to a first end of the second resistor 18 and to the non-inverted voltage input 1 of the second adaptive level shifter 20b. The second resistor 18 further includes a second end electrically connected to the inverted voltage input 2 of the second adaptive level shifter 20b and to the second reference voltage terminal $V_{REF2}$. Additionally, the non-inverted voltage output 3 of the second adaptive level shifter 20b is electrically connected to the inverted voltage input 6 of the first transconductance amplification block 12a, and the inverted voltage output 4 of the second adaptive level shifter is electrically connected to the inverted voltage input 6 of the second transconductance amplification block 12b.

When a differential input voltage $V_{DIFF}$ is received between the positive and negative input voltage terminals $V_{INP}$, $V_{INN}$, the first adaptive level shifter 20a can generate a voltage between non-inverted and inverted voltage outputs 3, 4 that is about equal to the differential input voltage $V_{DIFF}$. However, in contrast to the amplifier 10 of FIG. 1 in which the non-inverted and inverted voltage outputs 3, 4 of the first adaptive level shifter 20a are electrically connected to the non-inverted and inverted voltage inputs 5, 6 of the first transconductance amplification block 12a, the non-inverted and inverted voltage outputs 3, 4 of the first adaptive level shifter 20a of FIG. 2 are electrically connected to the non-inverted voltage inputs 5 of the first and second transconductance amplification blocks 12a, 12b, respectively. Additionally, in contrast to the amplifier 10 of FIG. 1 in which the non-inverted and inverted voltage outputs 3, 4 of the second adaptive level shifter 20b are electrically connected to the non-inverted and inverted voltage inputs 5, 6 of the second transconductance amplification block 12b, the non-inverted and inverted voltage outputs 3, 4 of the second adaptive level shifter 20b of FIG. 2 are electrically connected to the inverted voltage inputs 6 of the first and second transconductance amplification blocks 12a, 12b, respectively.

Connecting the non-inverted and inverted voltage outputs 3, 4 of the first and second adaptive level shifters 20a, 20b in this manner can reduce a magnitude of the difference between the non-inverted and inverted voltage inputs 5, 6 of the first and second transconductance amplification blocks 12a, 12b when the amplifier 30 is amplifying a differential input voltage $V_{DIFF}$. For example, when the amplifier 30 receives a differential input voltage $V_{DIFF}$ between the positive and negative input voltage terminals $V_{INP}$, $V_{INN}$, a voltage about equal to the differential input voltage $V_{DIFF}$ can be generated between the non-inverted and inverted voltage outputs 3, 4 of the first adaptive level shifter 20a. Additionally, when the amplifier 30 receives a differential input voltage $V_{DIFF}$, feedback within the amplifier 30 can result in a voltage about equal to the differential input voltage $V_{DIFF}$ being generated across the second resistor 18 and between the non-inverted and inverted voltage inputs 1, 2 of the second adaptive level shifter 20b. However, since the non-inverted voltage outputs 3 of the first and second adaptive level shifters 20a, 20b are electrically connected to the non-inverted and inverted voltage inputs 5, 6 of the first transconductance amplification block 12a, respectively, the difference in voltage between the non-inverted and inverted voltage inputs 5, 6 of the first transconductance amplification block 12a can be relatively small, such as a voltage of less than about 0.1 V, for example, a voltage about equal to 0 V. Likewise, since the inverted voltage outputs 4 of the first and second adaptive level shifters 20a, 20b are electrically connected to the non-inverted and inverted voltage inputs 5, 6 of the second transconductance amplification block 12b, respectively, the difference in voltage between the non-inverted and inverted voltage inputs 5, 6 of the second transconductance amplification block 12b can be relatively small, such as a voltage of less than about 0.1 V, for example, a voltage about equal to 0 V.

Accordingly, in contrast to the amplifier 10 of FIG. 1 that can generate a difference in voltage between the non-inverted and inverted voltage inputs 5, 6 of each of the first and second transconductance amplification blocks 12a, 12b that is about equal to the differential input voltage $V_{DIFF}$, the amplifier 30 of FIG. 2 illustrates a configuration in which the difference in voltage between the non-inverted and inverted voltage inputs 5, 6 of each of the first and second transconductance amplification blocks 12a, 12b can be relatively small, and in some implementations, about equal to 0 V.

Feedback within the amplifier 30 can generate a difference between the common-mode input voltage levels of the first and second transconductance amplification blocks 12a, 12b. For example, when a differential input voltage $V_{DIFF}$ is received between the positive and negative input voltage terminals $V_{INP}$, $V_{INN}$ of the amplifier 30, feedback within the amplifier 30 can result in the common-mode input voltage of the first transconductance amplification block 12a being greater than the common-mode input voltage of the second transconductance amplification block 12b by a voltage about equal to the differential input voltage $V_{DIFF}$. Thus, feedback within the amplifier 30 can result in the voltage difference between the non-inverted and inverted voltage inputs 5, 6 of each of the first and second transconductance amplification blocks 12a, 12b being relatively small, but the difference between the common-mode voltage of the non-inverted and inverted voltage inputs 5, 6 of the first transconductance amplification block 12a and the common-mode voltage of the non-inverted and inverted voltage inputs 5, 6 of the second transconductance amplification block 12b can be about equal to the differential input voltage $V_{DIFF}$.

In some implementations, the first and second transconductance amplification blocks 12a, 12b may have relatively poor performance when the differential input voltage between the non-inverted and inverted voltage inputs 5, 6 is relatively large. For example, the first and second transconductance amplification blocks 12a, 12b may not have enough headroom to amplify a relatively large differential input voltage. Furthermore, even when the first and second transconductance amplification blocks 12a, 12b use biasing schemes such as adaptive biasing to increase differential input voltage range, the power consumption of the first and second transconductance amplification blocks 12a, 12b may increase for large differential input voltages.

As described above, in the amplifier 30, the difference between the non-inverted and inverted voltage inputs 5, 6 of the transconductance amplification blocks 12a, 12b can be relatively small even when the amplifier 30 is amplifying a relatively large differential input voltage $V_{DIFF}$. Accordingly, the input differential voltage range of the first and second transconductance amplification blocks 12a, 12b need not limit the input differential voltage range of the amplifier 30. Additionally, since the difference between the non-inverted and inverted voltage inputs 5, 6 of the first and second transconductance amplification blocks 12a, 12b is relatively small, variations in power consumption versus input differential voltage magnitude of the transconductance amplification blocks should not significantly affect the overall power consumption of the amplifier 30. Accordingly, the amplifier 30 can have relatively low power consumption and/or relatively large input differential voltage range.

As the first and second transconductance amplification blocks 12a, 12b are configured to have a relatively small differential input voltage even when the amplifier 30 is amplifying a relatively large differential input voltage signal can also allow the first and second transconductance amplification blocks 12a, 12b to advantageously use chopping at the inputs without having to recharge the input capacitance of the transconductance amplification blocks, and therefore, without having to reduce the input impedance of the amplifier 30. Chopping refers to a technique of reducing input voltage offset of a transconductance amplification block in which the non-inverted and inverted voltage inputs and the non-inverted and inverted current outputs are each regularly swapped. For example, the first and second transconductance amplification blocks 12a, 12b each can include switches for regularly swapping both the non-inverted voltage input 5 with the inverted voltage input 6 and the non-inverted current output 7 with the inverted current output 8, thereby reducing the impact of input voltage offset of the first and second transconductance amplification blocks 12a, 12b. Since the first and second transconductance amplification blocks 12a, 12b of the amplifier 30 of FIG. 2 can exhibit a relatively small differential input voltage in use, the first and second transconductance amplification blocks 12a, 12b can use chopping without having to recharge the input capacitance of the transconductance amplification blocks by a relatively large voltage difference each time the non-inverted and inverted voltage inputs and the non-inverted and inverted current outputs are swapped. In contrast, when chopping is applied at the inputs of the first and second transconductance amplification blocks 12a, 12b of the amplifier 10 of FIG. 1 in order to reduce their input offset voltage, the input capacitance of the transconductance amplification blocks has to be recharged with alternating input differential voltage each cycle of the chopping period, which can significantly reduce the input impedance of the amplifier 10.

The first and second resistors 16, 18 can be used to control the gain of the amplifier 30. For example, when the differential input voltage $V_{DIFF}$ between the positive and negative voltage terminals $V_{INP}$, $V_{INN}$ increases, the voltage of the output voltage terminal $V_{OUT}$ can increase until the voltage difference across the non-inverted and inverted voltage inputs 1, 2 of the second adaptive level shifter 20b is about equal to the differential input voltage $V_{DIFF}$. In some implementations, the gain of the amplifier 30 can be about equal to $1+R_{16}/R_{18}$, where $R_{16}$ is the resistance of the first resistor 16 and $R_{18}$ is the resistance of the second resistor 18. Additional details of the first and second resistors 16, 18 can be similar to those described earlier with reference to FIG. 1.

The output offset voltage of the amplifier 30 can be controlled using the second reference voltage terminal $V_{REF2}$. For example, the voltage of the output terminal $V_{OUT}$ can be about equal to the voltage of the second reference voltage terminal $V_{REF2}$ when the differential input voltage $V_{DIFF}$ between the positive and negative input voltage terminals $V_{INP}$, $V_{INN}$ is about equal to 0 V. In some implementations, the second reference voltage terminal $V_{REF2}$ is electrically connected to a pad of an IC on which all or part of the amplifier 30 is disposed so as to allow an end-user to control the output offset voltage of the amplifier 30.

Figure 3:
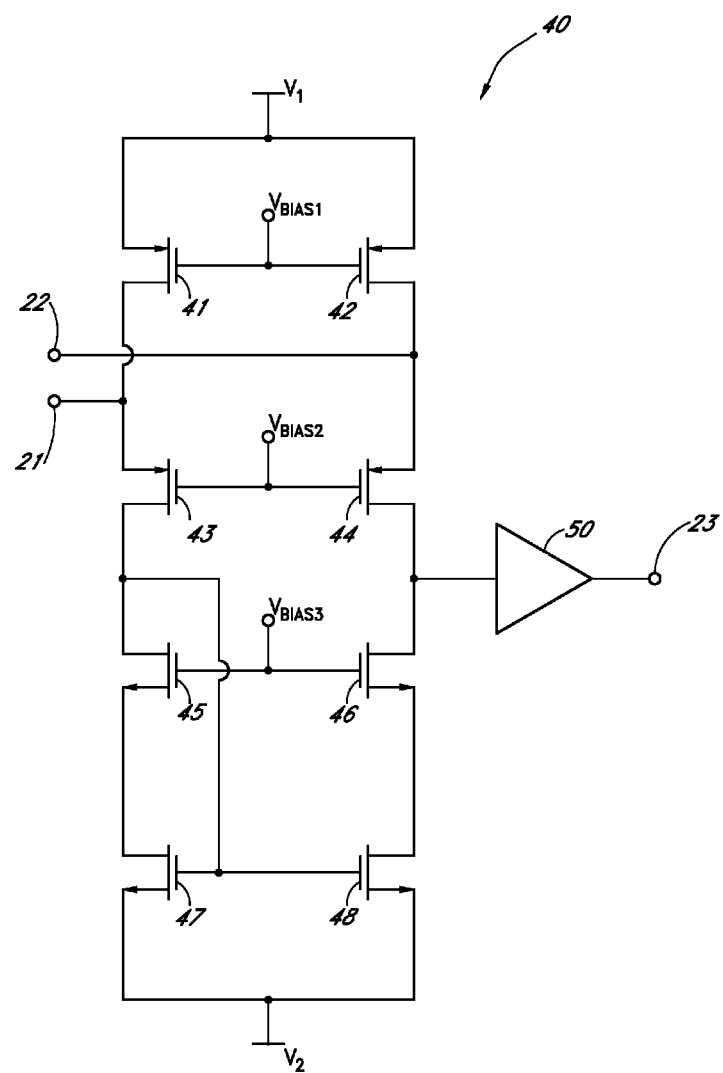
FIG. 3 is a circuit diagram of one example of a transimpedance amplification block.

FIG. 3 is a circuit diagram of one example of a transimpedance amplification block 40. The transimpedance amplification block 40 includes a non-inverted current input 21, an inverted current input 22, and a voltage output 23, and can be used to amplify a differential input current received between the non-inverted and inverted current inputs 21, 22 to generate a voltage signal on the voltage output 23. The transimpedance amplification block 40 further includes first to fourth PMOS transistors 41-44, first to fourth NMOS transistors 45-48, and a buffer stage 50. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The first PMOS transistor 41 includes a gate electrically connected to a gate of the second PMOS transistor 42 at a node configured to receive a first bias voltage $V_{BIAS1}$. The first PMOS transistor 41 further includes a drain electrically connected to a source of the third PMOS transistor 43 and to the non-inverted current input 21. The first and second PMOS transistors 41, 42 each further include a source electrically connected to a first supply voltage $V_1$, which can be, for example, a positive supply voltage. The third PMOS transistor 43 further includes a gate electrically connected to a gate of the fourth PMOS transistor 44 at a node configured to receive a second bias voltage $V_{BIAS2}$. The third PMOS transistor 43 further includes a drain electrically connected to a drain of the first NMOS transistor 45, to a gate of the third NMOS transistor 47, and to a gate of the fourth NMOS transistor 48.

The first NMOS transistor 45 further includes a gate electrically connected to a gate of the second NMOS transistor 46 at a node configured to receive a third bias voltage $V_{BIAS3}$. The first NMOS transistor 45 further includes a source electrically connected a drain of the third NMOS transistor 47. The third NMOS transistor 47 further includes a source electrically connected to a second supply voltage $V_2$, which can be, for example, a ground supply or negative supply voltage. The fourth NMOS transistor 48 further includes a source electrically connected to the second supply voltage $V_2$ and a drain electrically connected to a source of the second NMOS transistor 46. The second NMOS transistor 46 further includes a drain electrically connected to a drain of the fourth PMOS transistor 44 and to an input of the buffer stage 50. The buffer stage 50 further includes an output electrically connected to the voltage output 23. The fourth PMOS transistor 44 further includes a source electrically connected to a drain of the second PMOS transistor 42 and to the inverted current input 22.

The first, second and third bias voltages $V_{BIAS1}$-$V_{BIAS3}$ can be biased at any suitable voltage level. In one implementation, the voltage level of the first bias voltage $V_{BIAS1}$ is selected to be in the range of about 1 V more to about 3 V less than the first supply voltage $V_1$, the voltage level of the second bias voltage $V_{BIAS2}$ is selected to be in the range of about 1 V more to about 3 V less than the first supply voltage $V_1$, and the voltage level of the third bias voltage $V_{BIAS3}$ is selected to be in the range of about 1 V less to about 3 V more than the second supply voltage $V_2$. However, other voltage levels will be readily determined by one of skill in the art.

The buffer stage 50 can aid in improving the performance of the transimpedance amplification block 40. For example, the buffer stage 50 can be used to boost the output impedance of the transimpedance amplification block 40, thereby improving the performance of the transimpedance amplification block 40 relative to a configuration in which the drains of the fourth PMOS transistor 44 and the second NMOS transistor 46 are directly connected to the voltage output 23.

The transimpedance amplification block 40 can have any suitable transimpedance. In some implementations, the transimpedance amplification block 40 has a transimpedance in the range of about 1 V/µA to about 1000 MV/µA, for example, about 1 MV/µA. However, other transimpedance values will be readily determined by one of skill in the art.

Although the transimpedance amplification block 40 illustrates one example of a transimpedance amplification block suitable for use with the amplifier 10 of FIG. 1 and the amplifier 30 of FIG. 2, persons having ordinary skill in the art will appreciate that any other suitable transimpedance amplification block can be used in the amplifiers described herein.

Figure 4:
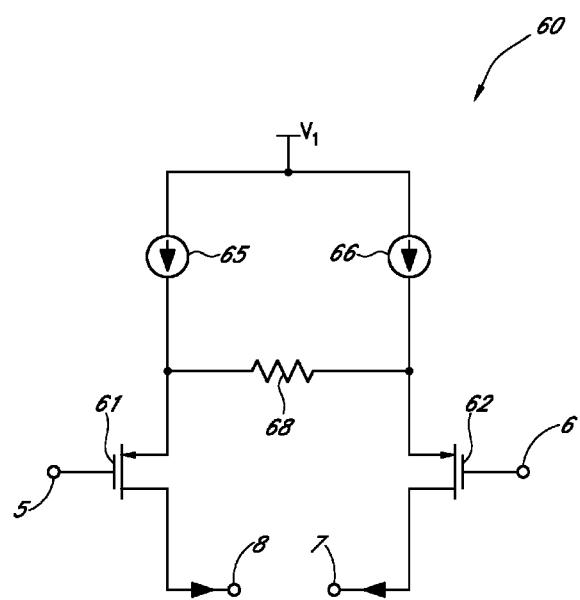
FIG. 4 is a circuit diagram of one example of a transconductance amplification block.

FIG. 4 is a circuit diagram of one example of a transconductance amplification block 60. The illustrated transconductance amplification block 60 includes first and second PMOS transistors 61, 62, first and second current sources 65, 66, and a resistor 68.

The transconductance amplification block 60 further includes a non-inverted voltage input 5, an inverted voltage input 6, a non-inverted current output 7, and an inverted current output 8. The transconductance amplification block 60 can receive a differential input voltage signal between the non-inverted and inverted voltage inputs 5, 6 and can amplify the differential input voltage signal to generate a differential output current between the non-inverted and inverted current outputs 7, 8.

The first PMOS transistor 61 includes a gate electrically connected to the non-inverted voltage input 5, a drain electrically connected to the inverted current output 8, and a source electrically connected to a first end of the first current source 65 and to a first end of the resistor 68. The first current source 65 further includes a second end electrically connected to the first supply voltage $V_1$. The second PMOS transistor 62 includes a gate electrically connected to the inverted voltage input 6, a drain electrically connected to the non-inverted current output 7, and a source electrically connected to a first end of the second current source 66 and to a second end of the resistor 68. The second current source 66 further includes a second end electrically connected to the first supply voltage $V_1$.

The resistor 68 can aid in converting the input differential voltage into the output differential current. For example, the voltage across the resistor 68 can change in relation to the difference between the gate voltages of the first and second PMOS transistors 61, 62, thereby generating a current through the resistor 68 corresponding to the differential output current. In one implementation, the transconductance value $G_M$ of the transconductance amplification block 60, or the ratio of the output differential current to the input differential voltage is about equal to $1/R_{68}$, where $R_{68}$ is the resistance of the resistor 68. In one implementation, the resistor 68 has a resistance that is selected to be in the range of about 100Ω to about 1 MΩ. However, other resistance values will be readily determined by one of skill in the art. The resistor 68 can be formed from polysilicon and/or any other suitable resistive materials. In some implementations, the resistor 68 can be formed from an active element, such as a MOS transistor biased in a linear mode of operation.

The first and second current sources 65, 66 can be any suitable value. In one implementation, the first and second current sources 65, 66 each generate a current having a magnitude in the range of about 0.1 µA to about 10 mA. However, other current magnitudes will be readily determined by one of skill in the art.

Although the transconductance amplification block 60 illustrates one example of a transconductance amplification block suitable for use with the amplifier 10 of FIG. 1 and the amplifier 30 of FIG. 2, persons having ordinary skill in the art will appreciate that any other suitable transconductance amplification block can be used in the amplifiers described herein.

FIGS. 5A-5D are circuit diagrams illustrating various phases of one implementation of an adaptive level shifter 70. The adaptive level shifter 70 includes a first capacitor 71a, a second capacitor 71b, a third capacitor 72a, a fourth capacitor 72b, first to eighth switching components 78a-78h, and a charger block 80. The first and second capacitors 71a, 71b can be referred to herein as a first pair of capacitors, and the third and fourth capacitors 72a, 72b can be referred to herein as a second pair of capacitors. The adaptive level shifter 70 further includes a non-inverted voltage input 1, an inverted voltage input 2, a non-inverted voltage output 3, and an inverted voltage output 4.

The non-inverted and inverted voltage outputs 3, 4 are electrically connected to the second and fourth switching components 78b, 78d, respectively. The non-inverted and inverted voltage inputs 1, 2 are electrically connected to the first and third switching components 78a, 78c, respectively, and to the charger block 80. The charger block 80 is also electrically connected to the fifth to eighth switching components 78e-78h, and is configured to receive the first voltage reference $V_{REF1}$. The first to eighth switching components 78a-78h are electrically coupled to the first pair of capacitors 71a, 71b and to the second pair of capacitors 72a, 72b, and can be used to control the electrically connectivity of the capacitors over various phases of the adaptive level shifter 70. Although the charger block 80 of FIGS. 5A-5D is illustrated as being electrically connected to the non-inverted and inverted voltage inputs 1, 2, the charger block 80 can be electrically connected in other ways. For example, in some implementations the charger block 80 is electrically connected to the non-inverted and inverted voltage outputs 3, 4 rather than to the non-inverted and inverted voltage inputs 1, 2.

The illustrated adaptive level shifter 70 is a switched capacitor circuit that can be used to shift a common-mode voltage level of a differential voltage signal received between the non-inverted and inverted voltage inputs 1, 2 to a common-mode level about equal to the voltage of the first reference voltage terminal $V_{REF1}$. For example, as will be described below, the adaptive level shifter 70 can be configured to generate a voltage on the non-inverted voltage output 3 that is about equal to $(V_{IN1}-V_{SHIFT})$ and a voltage on the inverted voltage output 4 that is about equal to $(V_{IN2}-V_{SHIFT})$, where $V_{IN}$ is the voltage of the non-inverted voltage input 1, $V_{IN2}$ is the voltage of the inverted voltage input 2, and $V_{SHIFT}$ is about equal to the difference between the common-mode input voltage $(V_{IN1}+V_{IN2})/2$ and the voltage of the first reference voltage terminal $V_{REF1}$.

FIGS. 5A-5D illustrate one example of the electrical connectivity of the adaptive level shifter 70 during a first phase, a second phase, a third phase, and a fourth phase, respectively.

Figure 5A:
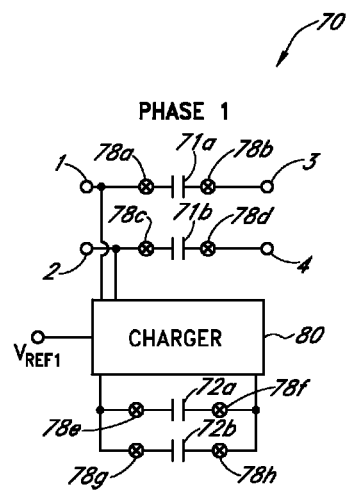
FIGS. 5A-5D are circuit diagrams illustrating various phases of one implementation of an adaptive level shifter.
Figure 5B:
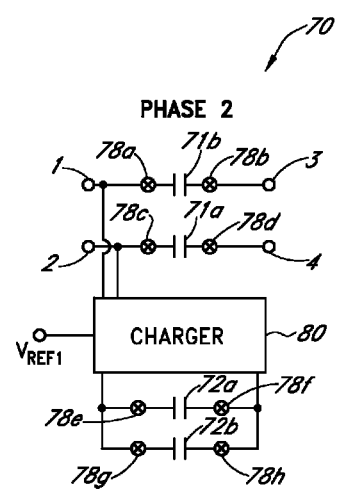

As shown in FIG. 5A, during the first phase, the switching components 78a-78h can be configured to electrically connect the first capacitor 71a between the non-inverted voltage input 1 and the non-inverted voltage output 3, to electrically connect the second capacitor 71b between the inverted voltage input 2 and the inverted voltage output 4, and to electrically connect the second pair of capacitors 72a, 72b to the charger block 80. Additionally, as shown in the FIG. 5B, during the second phase of the adaptive level shifter 70, the switching components 78a-78h can be configured to electrically connect the first capacitor 71a between the inverted voltage input 2 and the inverted voltage output 4, to electrically connect the second capacitor 71b between the non-inverted voltage input 1 and the non-inverted voltage output 3, and to electrically connect the second pair of capacitors 72a, 72b to the charger block 80.

Figure 5C:
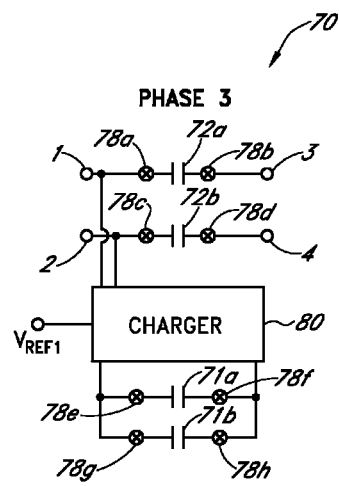
Figure 5D:
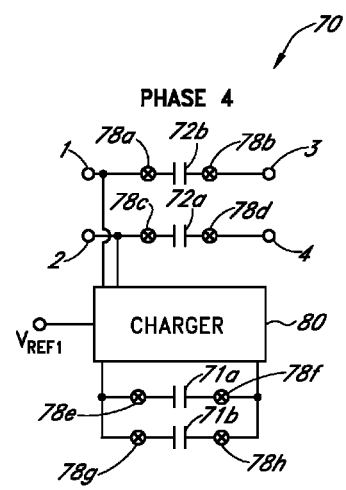

During the third phase of the adaptive level shifter 70 shown in FIG. 5C, the switching components 78a-78h can be configured to electrically connect the third capacitor 72a between the non-inverted voltage input 1 and the non-inverted voltage output 3, to electrically connect the fourth capacitor 72b between the inverted voltage input 2 and the inverted voltage output 4, and to electrically connect the first pair of capacitors 71a, 71b to the charger block 80. Additionally, as shown in the FIG. 5D, during the fourth phase of the adaptive level shifter 70, the switching components 78a-78h can be configured to electrically connect the third capacitor 72a between the inverted voltage input 2 and the inverted voltage output 4, to electrically connect the fourth capacitor 72b between the non-inverted voltage input 1 and the non-inverted voltage output 3, and to electrically connect the first pair of capacitors 71a, 71b to the charger block 80.

The adaptive level shifter 70 can be configured to switch between the electrical connectivities associated with the first, second, third and fourth phases over time. For example, the adaptive level shifter 70 can be configured to switch from the connectivity of the first phase to the connectivity of the second phase, from the connectivity of the second phase to the connectivity of the third phase, from the connectivity of the third phase to the connectivity of the fourth phase, and from the connectivity of the fourth phase back to the connectivity of the first phase. The adaptive level shifter 70 can be configured to operate in each phase for any suitable period of time, including, for example, a time in the range of about 100 ns to about 100 ms for each phase. However, other time values will be readily determined by one of skill in the art. As skilled artisans will appreciate, the adaptive level shifter 70 need not remain in each phase for the same amount of time, and that the adaptive level shifter 70 can be adapted to operate using more or fewer phases.

By switching the adaptive level shifter 70 between the first, second, third and fourth phases, the adaptive level shifter can be configured to shift the common-mode voltage of a differential input voltage signal received between the non-inverted and inverted voltage inputs 1, 2 so as to generate a differential output voltage signal between the non-inverted and inverted voltage outputs 3, 4 having a common-mode voltage about equal to $V_{REF1}$. For example, the adaptive level shifter 70 can be configured to generate a voltage on the non-inverted voltage output 3 that is about equal to $(V_{IN1}-V_{SHIFT})$ and a voltage on the inverted voltage output 4 that is about equal to $(V_{IN2}-V_{SHIFT})$, where $V_{IN1}$ is the voltage of the non-inverted voltage input 1, $V_{IN2}$ is the voltage of the inverted voltage input 2, and $V_{SHIFT}$ is about equal to the difference between the common-mode input voltage $(V_{IN1}+V_{IN2})/2$ and the voltage of the first reference voltage terminal $V_{REF1}$.

The charger block 80 can be electrically connected to the non-inverted and inverted voltage inputs 1, 2, and can be used to charge one or more capacitors to a voltage equal about the difference between the voltage of the first reference voltage terminal $V_{REF1}$ and the common-mode voltage of the non-inverted and inverted voltage inputs 1, 2. For example, during the first and second phases of the adaptive level shifter 70 shown in FIGS. 5A and 5B, respectively, the charger block 80 can be configured to charge the voltage across each of the third and fourth capacitors 72a, 72b to be about equal to $V_{SHIFT}$, where $V_{SHIFT}$ is the difference between the common-mode input voltage of the non-inverted and inverted voltage inputs 1, 2 and the voltage of the first reference voltage terminal $V_{REF1}$. Additionally, during the third and fourth phases of the adaptive level shifter 70 shown in FIGS. 5C and 5D, respectively, the charger block 80 can be configured to charge the voltage across each of the first and second capacitors 71a, 71b to be about equal to $V_{SHIFT}$.

The first to fourth switching components 78a-78d can be configured to insert the charged capacitors between the inputs and the outputs of the adaptive level shifter 70, thereby generating a differential output voltage signal that has a shifted common-mode voltage level. For example, the first pair of capacitors 71a, 71b can be inserted between the inputs and outputs of the adaptive level shifter 70 during the first and second phases, and the second pair of capacitors 72a, 72b can be inserted between the inputs and outputs of the adaptive level shifter 70 during the third and fourth phases. As shown in FIGS. 5A-5D, the capacitors can be regularly charged so as to maintain a voltage across each capacitor about equal to $V_{SHIFT}$. For example, the second pair of capacitors 72a, 72b can be charged during the first and second phases of the adaptive level shifter 70, and the first pair of capacitors 71a, 71b can be charged during the third and fourth phases of the adaptive level shifter 70.

When a capacitor is disconnected from the charger block 80, sampling noise can result in the voltage across the disconnected capacitor deviating from $V_{SHIFT}$. For example, when transitioning the adaptive level shifter 70 from the connectivity associated with the fourth phase to the connectivity associated with the first phase, a voltage sampling error can be generated across each of the first and second capacitors 71a, 71b when the capacitors are disconnected from the charger block 80.

To aid in reducing or eliminating the sampling noise, the first and second capacitors 71a, 71b can be regularly swapped so as to cancel the sampling noise. For example, the first capacitor 71a can be electrically connected between non-inverted voltage input 1 and the non-inverted voltage output 3 during the first phase and between the inverted voltage input 2 and the inverted voltage output 4 during the second phase, while the second capacitor 71b can be electrically connected between the inverted voltage input 2 and the inverted voltage output 4 during the first phase and between the non-inverted voltage input 1 and the non-inverted voltage output 3 during the second phase. Similarly, the sampling noise associated with the third and fourth capacitors 72a, 72b can be reduced or eliminated by electrically connecting the third capacitor 72a between the non-inverted voltage input 1 and the non-inverted voltage output 3 during the third phase and between the inverted voltage input 2 and the inverted voltage output 4 during the fourth phase, and by electrically connecting the fourth capacitor 72b between the inverted voltage input 2 and the inverted voltage output 4 during the third phase and between the non-inverted voltage input 1 and the non-inverted voltage output 3 during the fourth phase.

The voltage of the first reference voltage terminal $V_{REF1}$ can be generated in any suitable manner. For example, in some implementations the voltage of the first reference voltage terminal $V_{REF1}$ can be generated by a voltage regulator or other suitable voltage generator disposed in an IC in which the adaptive level shifter 70 is disposed. However, in other implementations, the first reference voltage terminal $V_{REF1}$ can be electrically connected to a pad of an IC so as to allow an end-user to control the voltage of the first reference voltage terminal $V_{REF1}$.

Although the adaptive level shifter 70 illustrates one example of an adaptive level shifter suitable for use with the amplifier 10 of FIG. 1 and the amplifier 30 of FIG. 2, any other suitable adaptive level shifter can be used in the amplifiers described herein, including, for example, adaptive level shifters that do not use switched capacitor circuitry.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
a first level shifter having a first input, a second input, a first output, and a second output, wherein the first and second inputs are configured to receive a differential input voltage signal, and wherein the first level shifter is configured to control a common-mode voltage of the first and second outputs to be about equal to a first voltage and to control a difference in voltage between the first and second outputs based on the differential input voltage signal;
a second level shifter having a first input, a second input, a first output, and a second output, wherein the second level shifter is configured to control a common-mode voltage of the first and second outputs to be about equal to the first voltage;
a first transconductance amplification circuit having a first input, a second input, a first output, and a second output, wherein the first input of the first transconductance amplification circuit is electrically connected to the first output of the first level shifter;
a second transconductance amplification circuit having a first input, a second input, a first output, and a second output, wherein the second input of the second transconductance amplification circuit is electrically connected to the second output of the second level shifter, and wherein the first and second outputs of the first transconductance amplification circuit are electrically connected to the second and first outputs of the second transconductance amplification circuit, respectively; and
a transimpedance amplification circuit having a first input, a second input, and an output, wherein the first and second inputs are electrically connected to the first and second outputs of the first transconductance amplification circuit.

2. The apparatus of claim 1, wherein the second output of the first level shifter is electrically connected to the first input of the second transconductance amplification circuit, and wherein the first output of the second level shifter is electrically connected to the second input of the first transconductance amplification circuit.

3. The apparatus of claim 2, wherein the first level shifter and the second level shifter are configured to generate a first common-mode voltage level for the first transconductance amplification circuit and to generate a second common-mode voltage level for the second transconductance amplification circuit such that a difference between the first common-mode voltage level and the second common-mode voltage level is about equal to a magnitude of the differential input voltage signal.

4. The apparatus of claim 1, further comprising a first resistor and a second resistor, wherein the first resistor includes a first end electrically connected to the output of the transimpedance amplification circuit and a second input electrically connected to the first input of the second level shifter, and wherein the second resistor includes a first end and a second end electrically connected to the first and second inputs of the second level shifter, respectively.

5. The apparatus of claim 1, wherein the second input of the second level shifter is configured to receive a reference voltage for controlling an output offset voltage of the transimpedance amplification circuit.

6. The apparatus of claim 1, wherein the first level shifter is configured to control a magnitude of the difference in voltage between the first and second outputs of the first level shifter to be about equal to the magnitude of the differential input voltage signal.

7. The apparatus of claim 1, wherein the first transconductance amplification circuit comprises:
a resistor;
a first current source;
a second current source;
a first metal oxide semiconductor (MOS) transistor having a gate electrically connected to the first input of the first transconductance amplification circuit, a drain electrically connected to the second output of the first transconductance amplification circuit, and a source electrically connected to the first current source and to a first end of the resistor; and
a second MOS transistor having a gate electrically connected to the first input of the first transconductance amplification circuit, a drain electrically connected to the second output of the first transconductance amplification circuit, and a source electrically connected to the second current source and to a second end of the resistor.

8. The apparatus of claim 1, wherein the second output of the first level shifter is electrically connected to the second input of the first transconductance amplification circuit, and wherein the first output of the second level shifter is electrically connected to the first input of the second transconductance amplification circuit.

9. The apparatus of claim 1, wherein the first level shifter and the second level shifter each comprise:
a plurality of capacitors including a first capacitor, a second capacitor, a third capacitor, and a fourth capacitor,
a plurality of switches electrically coupled to the plurality of capacitors, wherein the plurality of switches and the plurality of capacitors are configured to operate over at least a first phase, a second phase, a third phase, and a fourth phase; and
a charging block configured to charge the first and second capacitors during at least a portion of the third and fourth phases to a shift voltage about equal to a difference between a common-mode level of the differential input voltage signal and the first voltage, and to charge the third and fourth capacitors during at least a portion of the first and second phases to the shift voltage.

10. The apparatus of claim 9, wherein the plurality of switches of the first level shifter are configured to electrically connect the first capacitor between the first input and the first output of the first level shifter during the first phase and between the second input and the second output of the first level shifter during the second phase, and wherein the plurality of switches of the first level shifter are further configured to electrically connect the second capacitor between the second input and second output of the first level shifter during the first phase and between the first input and the first output of the first level shifter during the second phase, and wherein the plurality of switches of the first level shifter are further configured to electrically connect the third capacitor between the first input and first output of the first level shifter during the third phase and between the second input and the second output of the first level shifter during the fourth phase, and wherein the plurality of switches of the first level shifter are further configured to electrically connect the fourth capacitor between the second input and the second output of the first level shifter during the fourth phase and between the first input and the first output of the first level shifter output during the third phase.

11. The apparatus of claim 1, wherein the first transconductance amplification circuit is configured to convert the difference in voltage at the first and second inputs of the first transconductance amplification circuit to generate a first differential current between the first and second outputs of the first transconductance amplification circuit, and wherein the second transconductance amplification circuit is configured to convert the difference in voltage at the first and second inputs of the second transconductance amplification circuit to generate a second differential current between the first and second outputs of the second transconductance amplification circuit, and wherein the transimpedance amplification circuit is configured to convert a difference between the first and second differential currents to generate an output voltage signal on the output.

12. The apparatus of claim 1, wherein the first and second inputs of the first transconductance amplification circuit are a non-inverted voltage input and an inverted voltage input, respectively, and wherein the first and second outputs of the first transconductance amplification circuit are a non-inverted current output and an inverted current output, respectively, and wherein the first and second inputs of the second transconductance amplification circuit are a non-inverted voltage input and an inverted voltage input, respectively, and wherein the first and second outputs of the second transconductance amplification circuit are a non-inverted current output and an inverted current output, respectively, and wherein the first and second inputs of the transimpedance amplification circuit are a non-inverted current input and an inverted current input, respectively, and wherein the output of the transimpedance amplification circuit is a voltage output.

13. An apparatus, comprising:
a first means for level shifting having a first input, a second input, a first output, and a second output, wherein the first and second inputs are configured to receive a differential input voltage signal, and wherein the first level shifting means is configured to control a common-mode voltage of the first and second outputs to be about equal to a first voltage and to control a difference in voltage between the first and second outputs based on the differential input voltage signal;
a second means for level shifting having a first input, a second input, a first output, and a second output, wherein the second level shifting means is configured to control a common-mode voltage of the first and second outputs of the second level shifting means to be about equal to the first voltage;
a first transconductance amplification circuit having a first input, a second input, a first output, and a second output, wherein the first input of the first transconductance amplification circuit is electrically connected to the first output of the first level shifting means, wherein the first transconductance amplification circuit is configured to convert the difference in voltage at the first and second inputs to generate a first differential current between the first and second outputs;

a second transconductance amplification circuit having a first input, a second input, a first output, and a second output, wherein the second input of the second transconductance amplification circuit is electrically connected to the second output of the second level shifting means, and wherein the first and second outputs of the first transconductance amplification circuit are electrically connected to the second and first outputs of the second transconductance amplification circuit, respectively, wherein the second transconductance amplification circuit is configured to convert the difference in voltage at the first and second inputs to generate a second differential current between the first and second outputs; and a transimpedance amplification circuit having a first input, a second input, and an output, wherein the first and second inputs are electrically connected to the first and second outputs of the first transconductance amplification circuit, respectively, and wherein the transimpedance amplification circuit is configured to convert a difference between the first and second differential currents to generate an output voltage signal on the output.

14. The apparatus of claim 13, wherein the second output of the first level shifting means is electrically connected to the first input of the second transconductance amplification circuit, and wherein the first output of the second level shifting means is electrically connected to the second input of the first transconductance amplification circuit.

15. The apparatus of claim 13, wherein the second output of the first level shifting means is electrically connected to the second input of the first transconductance amplification circuit, and wherein the first output of the second level shifting means is electrically connected to the first input of the second transconductance amplification circuit.

16. The apparatus of claim 13, wherein the first level shifting means and the second level shifting means each comprise:

a plurality of capacitors including a first capacitor, a second capacitor, a third capacitor, and a fourth capacitor, a plurality of switches electrically coupled to the plurality of capacitors, wherein the plurality of switches and the plurality of capacitors are configured to operate over at least a first phase, a second phase, a third phase, and a fourth phase; and a charging block configured to charge the first and second capacitors during at least a portion of the third and fourth phases to a shift voltage about equal to a difference between a common-mode level of the differential voltage input and the first voltage, and to charge the third and fourth capacitors during at least a portion of the first and second phases to the shift voltage.

17. A method of electronic amplification comprising:

receiving a differential input voltage signal;

shifting a common-mode voltage of the differential input voltage signal to generate a first level-shifted differential voltage signal using a first level shifter;

shifting a common-mode voltage of a feedback signal associated with an output voltage signal to generate a second level-shifted differential voltage signal using a second level shifter;

converting the first and second level-shifted differential voltage signals to a first differential current signal and to a second differential current signal;

combining the first and second differential current signals; and amplifying the combined differential current signals using a transimpedance amplification block to generate the output voltage signal.

18. The method of claim 17, further comprising generating the feedback signal for the second level shifter using a plurality of resistors and the output voltage signal.

19. The method of claim 17, wherein converting the first and second level-shifted differential voltage signals to the first differential current signal and to the second differential current signal comprises converting the first level-shifted differential voltage signal to the first differential current signal using a first transconductance amplification block and converting the second level-shifted differential voltage signal to the second differential current signal using a second transconductance amplification block.

20. The method of claim 17, wherein converting the first and second level-shifted differential voltage signals to the first differential current signal and to the second differential current signal comprises converting a first signal of the first level-shifted differential voltage signal and a first signal of the second level-shifted differential voltage signal to the first differential current signal using a first transconductance amplification block and converting a second signal of the first level-shifted differential voltage signal and a second signal of the second level-shifted differential voltage signal to the second differential current signal using a second transconductance amplification block.

* * * * *